United States Patent [19]

Ciraula et al.

[11] Patent Number: 5,146,111

[45] Date of Patent: Sep. 8, 1992

[54] GLITCH-PROOF POWERED-DOWN ON CHIP RECEIVER WITH NON-OVERLAPPING OUTPUTS

[75] Inventors: Michael K. Ciraula; Christopher M. Durham, both of Manassas; Derwin L. Jallice, Reston, all of Va.

[73] Assignee: International Business Machines Corporation, Armonk, N.Y.

[21] Appl. No.: 683,236

[22] Filed: Apr. 10, 1991

[51] Int. Cl.[5] .......................................... H03K 5/13
[52] U.S. Cl. ........................... 307/296.3; 307/272.3; 307/585; 307/443; 365/188.06; 365/189.11; 365/189.05
[58] Field of Search ............. 307/296.3, 272.3, 585, 307/243, 443, 542; 365/185.05, 185.06, 185.11

[56] References Cited

U.S. PATENT DOCUMENTS

| | | | |
|---|---|---|---|
| 4,353,032 | 10/1982 | Taylor | 328/165 |
| 4,523,104 | 6/1985 | Norris et al. | 307/247 |
| 4,599,525 | 7/1986 | Tzeng | 307/234 |
| 4,638,187 | 1/1987 | Boler et al. | 307/585 |
| 4,677,593 | 6/1987 | Davis | 365/189.05 |
| 4,775,840 | 10/1988 | Ohmori et al. | 328/111 |
| 4,785,201 | 11/1988 | Martinez | 307/585 |
| 4,807,198 | 2/1989 | Flannagan et al. | 365/189.05 |
| 4,814,740 | 3/1989 | Kobayashi | 341/118 |
| 4,820,942 | 4/1989 | Chan | 307/542 |
| 4,839,538 | 6/1989 | Curtis | 307/456 |
| 4,853,685 | 8/1989 | Vogt | 340/825.170 |
| 4,857,760 | 8/1989 | Stuebing | 307/234 |
| 4,877,978 | 10/1989 | Platt | 307/585 |
| 4,883,993 | 11/1989 | Confalonieri et al. | 307/542.1 |
| 4,918,658 | 4/1990 | Shah et al. | 365/227 |
| 4,973,865 | 11/1990 | Haq | 307/542 |

Primary Examiner—Stanley D. Miller
Assistant Examiner—Scott A. Ouellette
Attorney, Agent, or Firm—Mark A. Wurm

[57] ABSTRACT

A circuit for providing a glitch-proof, powered-down inactive state to a memory array is disclosed. Cross-coupled NAND gates provide non-overlapping true/complement outputs for an on-chip receiver. Stable inactivation of both true and complement outputs is ensured without performance degrading delay stages.

1 Claim, 2 Drawing Sheets

GLITCH-PROOF POWERED-DOWN ON CHIP RECEIVER WITH NON-OVERLAPPING OUTPUTS

DESCRIPTION

This invention was made with Government support under contract number F29601-89-C-0016 awarded by the Department of the Air Force. The Government has certain rights in this invention.

BACKGROUND OF THE INVENTION

1. Technical Field

The invention disclosed broadly relates to memory technology and more particularly relates to memory chip powered-down glitch protection.

2. Background Art

Many VLSI products require on-chip receivers (OCR) that are powered-down when the chip is inactive. This means that the output of the OCR is forced into an inactive state and that the chip input pad is isolated from the internal operational nodes of the VLSI chip. This prevents the input pad from switching internal nodes on the chip and thereby eliminates power dissipation in a standby state, or when the chip is deactivated. Usually, this means that the output node or nodes are forced low (assuming positive logic). In many cases, the OCRs generate true and complement outputs from a given input signal both of which must be forced inactive. In addition, the input pad of the OCR must be completely isolated from any potential switching circuitry on the VLSI chip. Additional problems arise in the operation of powered-down OCRs when the chip comes from this powered-down (inactive) state to a powered-up (active) state. Potentially, the input to the chip can glitch, that is bounce from one logic state to another, if the timing between the activation signal and the OCR input pad signal is not carefully designed into the OCR.

Typically, signal timing is accomplished by delaying the chip select signal for some finite amount of time to allow the incoming signal to set up to the desired state. The incoming signal is enabled at a later stage by combination with the delayed chip enable signal. However, this requires the device to become dependent upon a delay circuit in order to insure proper operation and, in addition, increases the access time by the amount of time the chip select signal is delayed. The delay must be longer by a specified design margin to aid in reproducibility of the device. In a typical high speed application, this delay time can be on the order of five nanoseconds, which is significant compared to today's 40 nanoseconds or less required access time requirements.

Other problems arise from the case when the chip select signal delay is not properly designed and the input potential bounces from one logic state to another on the chip side of the OCR. In certain applications, this bouncing can degrade performance of the VLSI chip in question. For instance, in a static random access memory (SRAM), internal clocking pulses for the device are generated whenever the SRAM sees an input change state. When it sees a change, the chip clock begins to run and an access occurs. However, if a second input change occurs, then the chip must either abort the present access from the previous change, or continue with the present access and adjust for the new access specified. Aborting the present access for the address transition detection is very difficult to perform. Continuing the present access and adjusting for the new access specified is simpler, but increases access time by the fact there are certain clocking pulses generated by the input change that must take place before any access can begin. When two successive changes occur, there is a chance that these two clocking pulses cannot be simultaneous and will create either two distinct pulses or one long pulse to initiate the access operation. In either case, the access time is degraded by the bouncing of the inputs.

The prior art circuit of FIG. 1 relies, as shown, on a delay block 28 to delay the chip enable signal. In normal operation, chip select (CS) is low and the OCR operates by feeding the input signal through the true/complement signal generating AND circuitry 30 and 32 with the active, delayed chip select signal. In the power-down state, CS goes high which turns off devices 10 and 16, isolating the input pad from the chip. It is when the OCR comes out of this power-down state that is critical.

When the OCR comes out of the power-down (standby) state, CS transitions from a high to a low (active) level. CSB and CST are then generated immediately from devices 18 through 22 CSB and CST turn on devices 10 and 16 which allow the input signal from the OCR to reach node 100. This signal reaches the inputs to the true/complement generating AND gates 30 and 32. However, the outputs true and complement stay low until the delayed CS signal reaches the AND gates to enable them. When the delayed CS signal reaches the AND gates, the signals are then allowed to enter the device to start a memory access.

Problems with the prior art design become evident in this mode of operation. A CS delay circuit is necessary to delay the CS signal prior to enabling the output signals. The circuit must track along with any delay inside the circuit that runs in parallel to it. This also means that the delay must be long enough to provide a comfortable design margin, otherwise a potential glitching event can occur. Because the introduced delay in the CS signal must provide a comfortable design margin, the access time of the device will be increased. This is due to the fact that the access cannot begin until the signal passes the CS enabling point and enters the device for operation. The delay must be longer than the normal path to prevent glitching, therefore increasing the access time.

Because the normal path through the OCR runs in parallel with the CS delay circuit, there exists a race condition between the two signals to the AND gates for the logical combination. This race condition can cause glitching of the outputs if the CS signal reaches the AND gate before the signal from the chip input pad. Both outputs from the circuitry can both be in an on state for a brief period of time when the input signal switches. When the input rests at one logic state, then one of the two outputs sits high while the other sits low. If the input now switches to the other logic, then possibly the off output can go on before the on output turns off.

The circuit described in the present invention illustrates a new OCR design that contains a powered-down feature while providing non-glitching output signals with the added feature of guaranteed non-overlapping true and complement output signals. That is, the output will not glitch (or bounce) on the power operation which provides for single switching outputs that therefore would generate only one internal clocking pulse in the case of a SRAM operation application. In addition, it should be pointed out that this idea is not restricted to a true/complement OCR. Either side may be used to select a single sided OCR.

OBJECTS OF THE INVENTION

It is an object of the invention to provide a new circuit for powering-down an input pad interface to an integrated circuit exterior logic. This allows the input signal to cycle or remain static at any voltage level without any power dissipation penalty during a standby mode.

It is another object of the invention to provide an improved memory circuit which provides true and complement signals that are guaranteed to be non-overlapping. Both outputs cannot be in the active state at the same time. This simplifies other chip circuitry that receives the outputs since they cannot be simultaneously active.

It is another object of the invention to provide inactive outputs in the standby mode, that is, the output signals on the new circuit will always be forced into the inactive state in standby. This ensures that subsequent chip circuitry will also be deactivated in standby.

It is another object of the invention to provide an OCR design which does not depend upon a chip select delay circuit. This provides for improved performance while preventing potential output glitches and foregoes chip select delay block circuitry tracking.

SUMMARY OF THE INVENTION

These and other objects, features and advantages of the present invention are achieved in the present invention which describes and claims an OCR design that contains the powered-down feature while providing non-glitching output signals with the added feature of the guaranteed non-overlapping true and complement output signals. This provides increased performance since no chip select delay circuitry exists. The circuit output signals cannot glitch in powered-up operation since inputs directly feed the output signal and no delay path exists in which the input signal must race against.

The present invention is a novel design comprising two 2-input NAND gates having true and complement outputs that are turned on and off in such a fashion that they must do so sequentially. A chip select input provides high and low logical nodes as well as a pass gate for the chip input signal. Upon receiving both signals, the pair of NAND gates combine them in such a way that the output is formed sequentially. The output of the NAND gates is provided to output inverters which provide a true and complement signal in a non-glitching, non-overlapped manner.

BRIEF DESCRIPTION OF THE DRAWINGS

These and other objects, features and advantages of the invention will be more fully appreciated with reference to the accompanying figures.

DESCRIPTION OF THE BEST MODE FOR CARRYING OUT THE INVENTION

Figure 1:
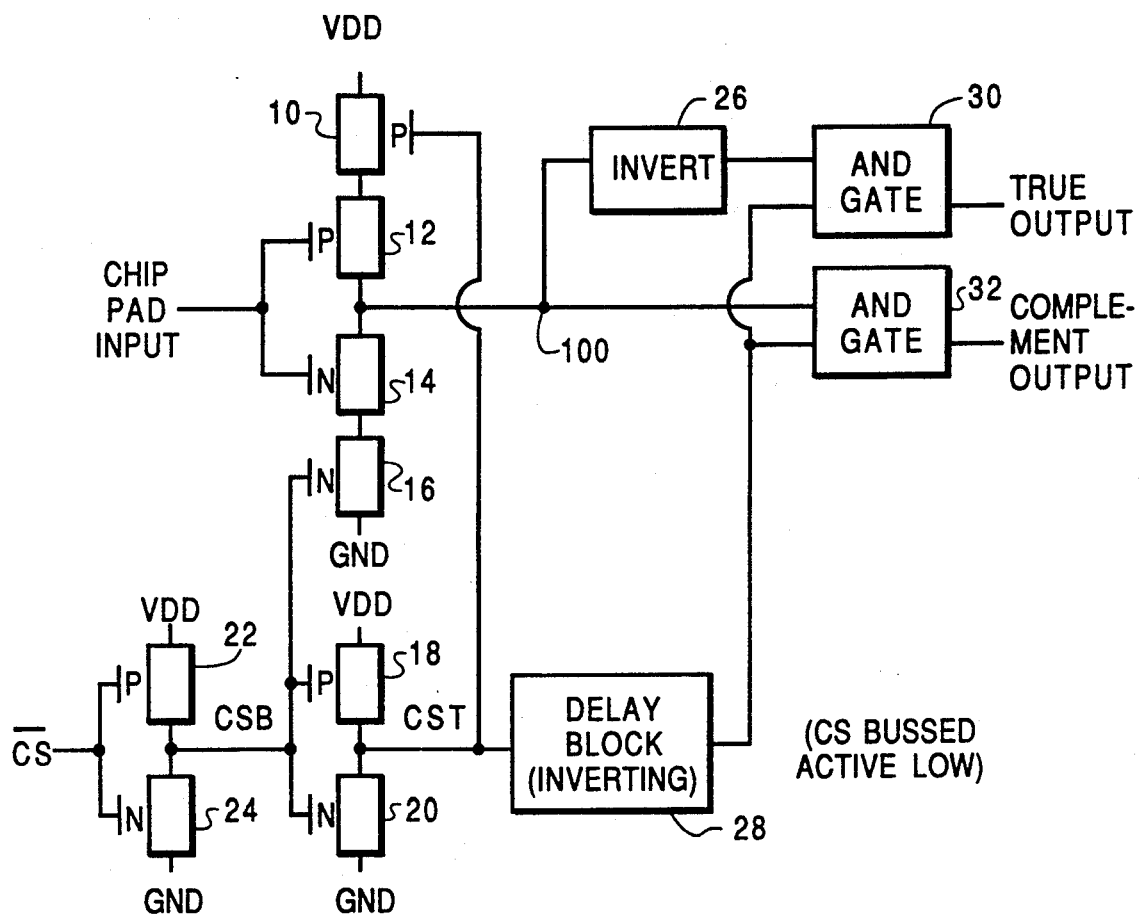
FIG. 1 is a circuit schematic diagram of the state of the art circuit for an on-chip receiver having delay blocks and AND gate outputs.
Figure 2:
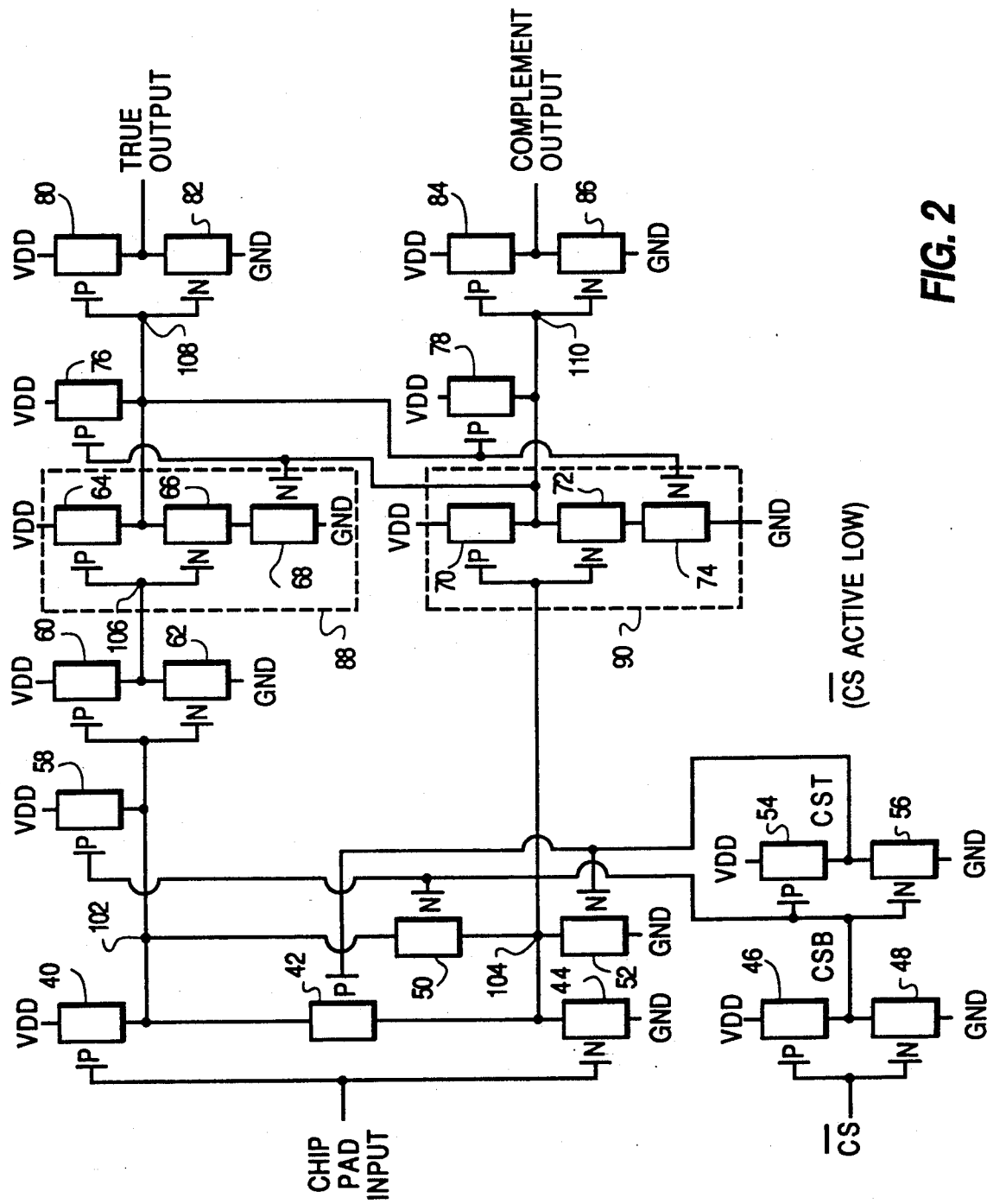
FIG. 2 is a circuit schematic diagram of the present invention incorporating non-glitching true and complement outputs.

The novel on-chip receiver (OCR) circuit is shown in FIG. 2. The circuit is shown as laid out in CMOS technology and employs several inverters and two, 2-input NAND gates and has inverting true and complement outputs.

The circuit can be best described in reference to FIG. 2 when the layout and operation are explained as follows. First considering the case when chip select (CS) is high. When CS is high, that is the chip is inactive, CSB is low and CST is high, turning devices 42 and 50 off and devices 58 and 52 on. This forces node 104 low and node 102 high. Node 102 high makes node 106 low. The two, 2-input NAND gates 88 and 90 are formed by devices 64, 76, 66, 68 and 70, 72, 74 and 78, respectively. The output of the NAND gates node 108 and node 110 are high which makes both true and complement outputs low. Therefore, while the chip is inactive, the OCR outputs remain in an off state.

Now consider the case when CS is low or active. When CS is low, CSB is high and CST is low, turning devices 42 and 50 off and devices 58 and 52 off. This connects node 102 and node 104 together via the pass gate of devices 42 and 50. If the input is now low, then input device 44 is off and 40 is on. Nodes 102 and 104 are now pulled high by device 40 which forces the node 106 low. Node 104 high turns device 72 on and device 70 off. Node 106 low turns device 64 on and device 66 off which forces node 108 high, which turns device 74 on and device 78 off. Therefore, node 110 pulls low via devices 72 and 74. Since node 108 is high and node 110 is low, the true output goes low while the complement output goes high. Notice that the two NAND gates require non-overlapping of the switching state since node 110 cannot go low until node 108 goes high. This means that the complement output cannot go high until node 108 goes high (which means that the true output goes low).

Likewise, if the input to the chip pad is high, input device 40 turns off while device 44 turns on. Nodes 102 and 104 are now pulled low by device 44 (node 102 via devices 42 and 50), making node 106 high. Node 104 low turns device 72 off and device 70 on forcing node 110 high while node 106 high turns device 64 off and device 66 on. Node 110 high turns device 68 on and device 76 off. Therefore, node 108 pulls low via devices 66 and 68. Since node 108 is low and node 110 is high, the true output goes high while the complement output goes low. Notice that the two NAND gates again require non-overlapping of the switching state since node 108 cannot go low until node 110 goes high. This means that the true output cannot go high until node 110 goes high (and the complement output goes low).

If the CS signal is high (inactive) and transitions low (active) then operation of the new circuit proceeds similarly. In this mode the input signal is not allowed to feed the circuit until the CS signal transitions to activate the OCR. When the CS signal does activate the OCR, operation follows that described above.

If the CS signal transitions from the low (active) state to the high (inactive) state, then the new circuit shuts off the input pad from the internal circuitry. Simultaneously, the true and complement outputs are both driven low to the inactive state. The OCR is now in the off state.

The inventive on-chip receiver circuit described illustrates a new design that provides a powered-down input pad with many advantages over the prior art circuit. The new design exceeds prior designs in performance and in design simplicity by deleting the internal chip select delay block. Without this delay block, the design becomes simpler to design since no race conditions can exist between the incoming data signal and the chip select signal. This provides for non-glitching outputs without the need for design considerations based on delay block tracking against parallel circuitry. Another advantage of the new design is non-overlapping true and complement output signals. That is, the two complementary output signals can never be simultaneously active. The new OCR design provides a simple, high performance receiver with a powered-down input and non-glitching, non-overlapping complementary outputs.

Although a specific embodiment of the invention has been disclosed, it will be understood by those having skill in the art that changes can be made to the specific embodiment and in using various semiconductor technologies without departing from the spirit and the scope of the invention.

What is claimed is:

1. A circuit for glitch-proof, power inactivation for an on-chip receiver in an integrated circuit chip, comprising:

a chip pad input circuit having an input node connected to a chip pad for receiving logic signal inputs and having a first output node and a second output node selectively connected together through a pass gate;

a chip select input circuit having an input connected to receive a chip select signal and an output coupled to said chip pad input circuit, for selectively turning off said pass gate when said chip select signal deselects the integrated circuit chip and applying a first voltage to said first output node and a second output voltage to said second output node of said chip pad input circuit;

said chip select input circuit selectively turning on said pass gate when said chip select signal selects said integrated circuit chip and enabling logic signals present on said chip pad to be represented on said first and second output nodes of said chip pad input circuit;

a first, two input NAND gate having an output node and an input coupled through an inverter to said first output node of said chip pad input circuit;

a second, two input NAND gate having an output node and an input coupled to said second output node of said chip pad input circuit;

said output node of said first NAND gate coupled to a second input of said second NAND gate and said output node of said second NAND gate coupled to a second input of said first NAND gate;

whereby logic signals present at said chip pad are represented at said output nodes of said first and second NAND gates when said chip select signal selects said chip and alternately, said logic signals present at said chip pad are prevented from being represented at said output nodes of said first and second NAND gates when said chip select signal deselects said chip.

* * * * *